United States Patent
Suwa et al.

(10) Patent No.: US 11,862,677 B2
(45) Date of Patent: Jan. 2, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takeshi Suwa, Kawasaki Kanagawa (JP); Tomoko Matsudai, Tokyo (JP); Yoko Iwakaji, Tokyo (JP); Hiroko Itokazu, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/385,846

(22) Filed: Jul. 26, 2021

(65) Prior Publication Data
US 2022/0293727 A1 Sep. 15, 2022

(30) Foreign Application Priority Data
Mar. 11, 2021 (JP) .................... 2021-039142

(51) Int. Cl.
*H01L 29/06* (2006.01)
*H01L 29/78* (2006.01)
*H01L 29/739* (2006.01)

(52) U.S. Cl.
CPC ...... *H01L 29/0642* (2013.01); *H01L 29/0649* (2013.01); *H01L 29/7397* (2013.01); *H01L 29/7813* (2013.01); *H01L 29/7831* (2013.01)

(58) Field of Classification Search
CPC ............. H01L 29/0642; H01L 29/0649; H01L 29/7397; H01L 29/7813; H01L 29/7831; H01L 29/0653; H01L 29/0865; H01L 29/1095; H01L 29/42376; H01L 29/7812; H01L 29/7824; H01L 29/66712–66734;
(Continued)

(56) References Cited

U.S. PATENT DOCUMENTS

| 5,708,286 A | 1/1998 | Uesugi et al. |
| 2013/0161736 A1* | 6/2013 | Hung ............... H01L 21/0475 438/270 |
| 2018/0261666 A1* | 9/2018 | Zeng ................ H01L 29/0878 |

FOREIGN PATENT DOCUMENTS

| JP | H08-274327 A | 10/1996 |
| JP | H10-214969 A | 8/1998 |

* cited by examiner

Primary Examiner — Cuong B Nguyen
(74) Attorney, Agent, or Firm — Kim & Stewart LLP

(57) ABSTRACT

A semiconductor device includes a semiconductor part, a first electrode and control electrodes at the front side of the semiconductor part. The semiconductor part includes first to fourth layers, first and third layers being of a first conductivity type, second and fourth layers being of a second conductivity type. The control electrodes are provided in a plurality of trenches, respectively. The control electrodes include a first control electrode, and a second control electrode next to the first control electrode. The second layer is provided between the first layer and the first electrode. The third and fourth layers are provided between the second layer and the first electrode. The semiconductor part further includes a first region partially provided between the first and second layers. The first region is provided between the first and third layers, the first region including a material having a lower thermal conductivity than the first layer.

14 Claims, 6 Drawing Sheets

(58) Field of Classification Search
CPC ......... H01L 29/7802–7815; H01L 21/823487; H01L 29/66666; H01L 29/7827–7828; H01L 29/78642; H01L 51/057; H01L 29/0696; H01L 29/7375; H01L 29/7393–7395; H01L 29/66325; H01L 29/66333–66348
See application file for complete search history.

SEMICONDUCTOR DEVICE

CROSS-REFERENCE TO RELATED APPLICATIONS

This application is based upon and claims the benefit of priority from Japanese Patent Application No. 2021-039142, filed on Mar. 11, 2021; the entire contents of which are incorporated herein by reference.

FIELD

Embodiments relate to a semiconductor device.

BACKGROUND

It is desirable for a power control semiconductor device to have high tolerance to heat generation due to an overcurrent. A transistor that has a MOS (Metal Oxide Semiconductor) structure includes, for example, a p-n-p parasitic transistor; and the parasitic transistor may be turned on by the heat generation due to the overcurrent. When the parasitic transistor is turned on, so-called thermal runaway may occur in which the current and the heat generation further increase, and ultimately results in element breakdown.

DETAILED DESCRIPTION

Figure 1:
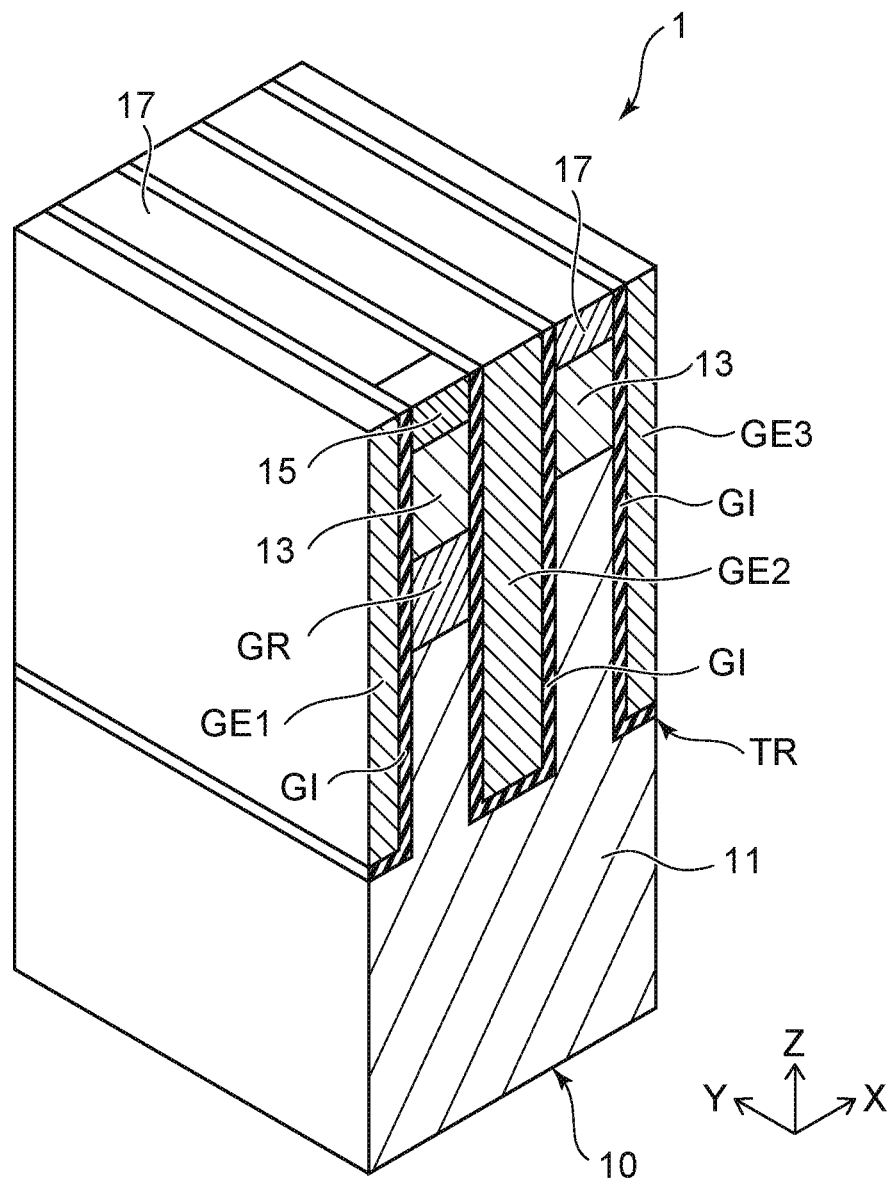
FIG. 1 is a perspective view schematically showing a semiconductor device according to an embodiment.

According to an embodiment, a semiconductor device includes a semiconductor part, a first electrode and a plurality of control electrodes. The semiconductor part includes a first semiconductor layer of a first conductivity type, a second semiconductor layer of a second conductivity type, a third semiconductor layer of the first conductivity type, and a fourth semiconductor layer of the second conductivity type. The plurality of trenches are provided at a front side of the semiconductor part. The first electrode is provided at the front side of the semiconductor part. The plurality of control electrodes are provided in the plurality of trenches, respectively. The plurality of control electrodes each are electrically insulated from the semiconductor part via an insulating film. The plurality of control electrodes include a first control electrode, and a second control electrode next to the first control electrode. The second semiconductor layer is provided between the first semiconductor layer and the first electrode. The second semiconductor layer is provided between the first and second control electrodes. The second semiconductor layer faces the first and second control electrodes via the insulating film. The third and fourth semiconductor layers are provided between the second semiconductor layer and the first electrode. The third and fourth semiconductor layers are electrically connected to the first electrode and arranged along a front surface of the second semiconductor layer facing the first electrode. The semiconductor part further includes a first region partially provided between the first semiconductor layer and the second semiconductor layer. The first region is provided between the first semiconductor layer and the third semiconductor layer, the first region including a material having a lower thermal conductivity than the first semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a perspective view schematically showing a semiconductor device 1 according to an embodiment. The semiconductor device 1 is, for example, a MOSFET (Metal Oxide Semiconductor Field Effect Transistor) or an IGBT (Insulated Gate Bipolar Transistor).

The semiconductor device 1 includes, for example, a semiconductor part 10, a first electrode, a second electrode, and multiple control electrodes GE1 to GE3. The first electrode is provided on the front surface of the semiconductor part 10; and the second electrode is provided on the back surface of the semiconductor part 10 (referring to FIGS. 2A and 2B). The first electrode and the second electrode are not illustrated in FIG. 1.

As shown in FIG. 1, the semiconductor device 1 includes the multiple control electrodes GE1 to GE3. The control electrodes GE1 to GE3 are provided respectively inside trenches TR that are provided in the semiconductor part 10. The control electrodes GE1 to GE3 are electrically insulated from the semiconductor part 10 respectively by a gate insulating film GI. The control electrodes GE1 and GE2 are, for example, gate electrodes. The control electrode GE3 is controlled, for example, independently of the control electrodes GE1 and GE2.

The control electrode GE2 is next to the control electrode GE1. The control electrode GE2 is provided between the control electrode GE1 and the control electrode GE3. The control electrode GE3 is next to the control electrode GE2.

The semiconductor part 10 includes, for example, a first semiconductor layer 11 of a first conductivity type, a second semiconductor layer 13 of a second conductivity type, a third semiconductor layer 15 of the first conductivity type, and a fourth semiconductor layer 17 of the second conductivity type. The semiconductor part 10 includes, for example, silicon. Hereinbelow, the first conductivity type is described as an n-type, and the second conductivity type is described as a p-type.

The first semiconductor layer 11 is, for example, an n-type drift layer or an n-type base layer. The control electrodes GE1 to GE3 extend from the front side of the semiconductor part 10 into the first semiconductor layer 11.

The second semiconductor layer 13 is, for example, a p-type diffusion layer or a p-type base layer. The second semiconductor layer 13, for example, is provided on the first semiconductor layer 11 between the control electrode GE1 and the control electrode GE2 and between the control electrode GE2 and the control electrode GE3. The second semiconductor layer 13 faces the control electrodes GE1 to GE3 via the gate insulating film GI.

The third semiconductor layer 15 is, for example, an n-type source layer or an n-type emitter layer. The third semiconductor layer 15 is provided on the second semiconductor layer 13 between the control electrode GE1 and the control electrode GE2. For example, the third semiconductor layer 15 contacts the gate insulating film GI at a side of the control electrode GE1.

The fourth semiconductor layer 17 is, for example, a p-type contact layer. The fourth semiconductor layer 17 is provided on the second semiconductor layer 13 between the control electrode GE1 and the control electrode GE2 and between the control electrode GE2 and the control electrode GE3. The third semiconductor layer 15 and the fourth semiconductor layer 17 are arranged on the second semiconductor layer 13 between the control electrode GE1 and the control electrode GE2. The fourth semiconductor layer 17 includes a second-conductivity-type impurity with a higher concentration than a second-conductivity-type impurity of the second semiconductor layer 13.

As shown in FIG. 1, the semiconductor part 10 further includes a guard region GR. The guard region GR is partially provided between the first semiconductor layer 11 and the second semiconductor layer 13. The guard region GR is located between the control electrodes GE1 and GE2. Also, the guard region GR is positioned between the first semiconductor layer 11 and the third semiconductor layer 15.

The guard region GR includes a material that has a lower thermal conductivity than the first semiconductor layer 11. In other words, the guard region GR suppresses the thermal conduction from the first semiconductor layer 11 into the second semiconductor layer 13. That is, the Joule heat generated in the first semiconductor layer 11 is suppressed to conduct into the region of the second semiconductor layer 13 under the third semiconductor layer 15.

The guard region GR may include, for example, an insulating body. The guard region GR includes the same material as the gate insulating film GI, e.g., silicon oxide. The guard region GR may include a semiconductor that has an amorphous structure, e.g., amorphous silicon.

Figure 2A:
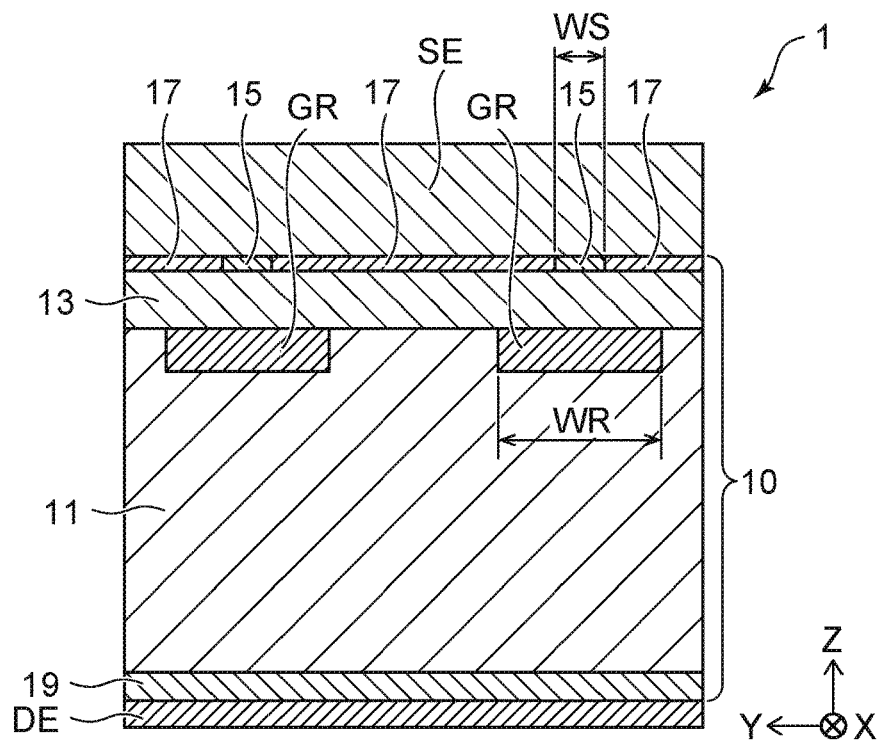
FIGS. 2A and 2B are schematic cross-sectional views showing the semiconductor device according to the embodiment.

FIG. 2A is a schematic cross-sectional view showing the semiconductor device 1 according to the embodiment. FIG. 2A is a schematic view illustrating a cross section parallel to the Y-Z plane between the control electrode GE1 and the control electrode GE2. The semiconductor device 1 is a MOSFET.

As shown in FIG. 2A, the semiconductor device 1 includes a first electrode SE and a second electrode DE. The first electrode SE is, for example, a source electrode. The second electrode DE is, for example, a drain electrode. The semiconductor part 10 is provided between the first electrode SE and the second electrode DE. The control electrodes GE1 to GE3 extend into the first semiconductor layer 11 from the front surface of the semiconductor part 10 that faces the first electrode SE (referring to FIG. 1).

The first semiconductor layer 11 extends between the first electrode SE and the second electrode DE. The first semiconductor layer 11 is, for example, an n-type drift layer.

The second semiconductor layer 13 is provided between the first semiconductor layer 11 and the first electrode SE. The second semiconductor layer 13 is, for example, a p-type diffusion layer.

The third semiconductor layer 15 and the fourth semiconductor layer 17 are provided between the second semiconductor layer 13 and the first electrode SE. The third semiconductor layer 15 is, for example, an n-type source layer.

The third semiconductor layer 15 and the fourth semiconductor layer 17 are arranged along the surface of the second semiconductor layer 13 that faces the first electrode SE. The third semiconductor layer 15 and the fourth semiconductor layer 17 are in contact with the first electrode SE and electrically connected thereto. The second semiconductor layer 13 is electrically connected to the first electrode SE via the fourth semiconductor layer 17.

The control electrodes GE1 to GE3 (referring to FIG. 1) extend in a direction (e.g., a Y-direction) along the front surface of the semiconductor part 10. The second semiconductor layer 13 and the fourth semiconductor layer 17 extend along the extension direction of the control electrodes GE1 to GE3 (i.e., the Y-direction).

For example, the third semiconductor layer 15 and the fourth semiconductor layer 17 are arranged in the extension direction of the control electrodes GE1 and GE2 (i.e., the Y-direction). The width in the Y-direction of the fourth semiconductor layer 17 is greater than the width in the Y-direction of the third semiconductor layer 15.

The guard region GR is partially provided between the first semiconductor layer 11 and the second semiconductor layer 13. The guard region GR is positioned between the first semiconductor layer 11 and the third semiconductor layer 15. A width WR of the guard region GR is greater than a width WS of the third semiconductor layer 15 in a direction (e.g., the Y-direction) along the boundary between the first semiconductor layer 11 and the second semiconductor layer 13. The second semiconductor layer 13 includes a portion that is positioned between the guard region GR and the fourth semiconductor layer 17.

The semiconductor part 10 further includes a fifth semiconductor layer 19 of the first conductivity type. The fifth semiconductor layer 19 is, for example, a drain layer. The fifth semiconductor layer 19 is provided between the first semiconductor layer 11 and the second electrode DE. The fifth semiconductor layer 19 includes a first-conductivity-type impurity with a higher concentration than a first-conductivity-type impurity of the first semiconductor layer 11. For example, the fifth semiconductor layer 19 is in contact with the second electrode DE and electrically connected thereto. The second electrode DE is electrically connected to the first semiconductor layer 11 via the fifth semiconductor layer 19.

Figure 2B:
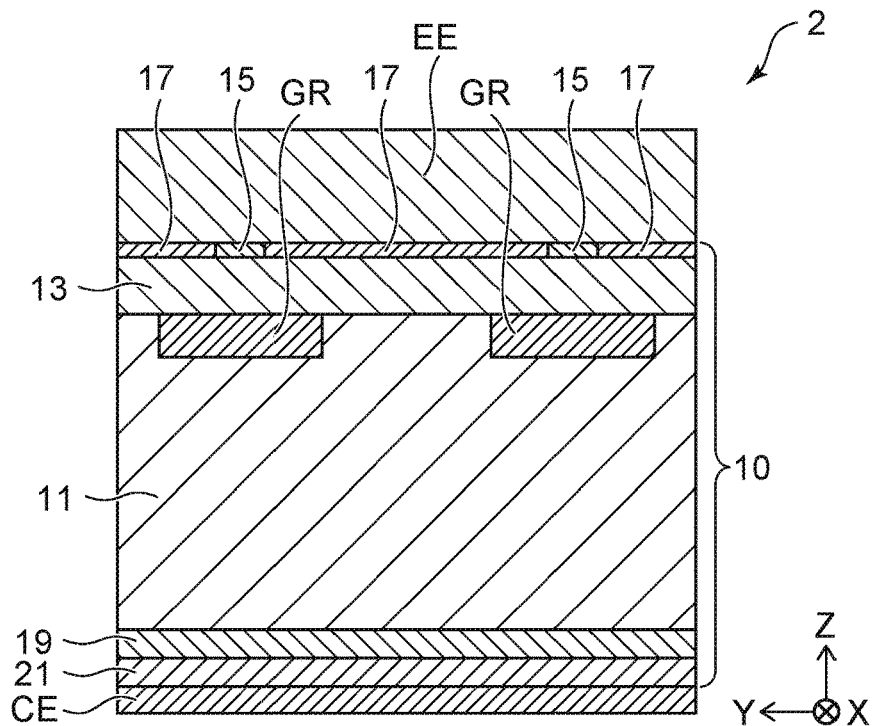

FIG. 2B is a schematic cross-sectional view showing a semiconductor device 2 according to the embodiment. FIG. 2B is a schematic view illustrating a cross section parallel to the Y-Z plane between the control electrode GE1 and the control electrode GE2. The semiconductor device 2 is, for example, an IGBT.

As shown in FIG. 2B, the semiconductor device 2 includes a first electrode EE and a second electrode CE. The first electrode EE is, for example, an emitter electrode. The second electrode CE is, for example, a collector electrode. The semiconductor part 10 is provided between the first electrode EE and the second electrode CE. The first semiconductor layer 11 is, for example, an n-type base layer. The second semiconductor layer 13 is, for example, a p-type base layer. The third semiconductor layer 15 is, for example, an n-type emitter layer. The fifth semiconductor layer 19 is, for example, an n-type buffer layer.

The semiconductor part 10 further includes a sixth semiconductor layer 21 of the second conductivity type. The sixth semiconductor layer 21 is provided between the fifth semiconductor layer 19 and the second electrode CE. The sixth semiconductor layer 21 is, for example, a p-type collector layer. The sixth semiconductor layer 21 is in contact with the second electrode CE and electrically connected thereto.

Also, in the example, the semiconductor part 10 includes the guard region GR. The guard region GR is partially provided between the first semiconductor layer 11 and the second semiconductor layer 13. Also, the guard region GR is provided between the first semiconductor layer 11 and the third semiconductor layer 15.

The semiconductor device 1 or the semiconductor device 2 according to the embodiment is used in, for example, a power conversion device such as an inverter, etc., and is connected in series with another semiconductor device between power lines. When a short-circuit fault occurs in, for example, the other semiconductor device, a short-circuit current (an overcurrent) flows in the semiconductor device 1 or 2. By providing the guard region GR in the semiconductor devices 1 and 2, the thermal conduction from the first semiconductor layer 11 into the second semiconductor layer 13 is suppressed, and the Joule heat generated by such an overcurrent can be prevented from conducting in the second semiconductor layer 13. Thus, it is possible in the second semiconductor layer 13 to prevent the temperature increase. Therefore, the n-p-n parasitic transistor that includes the first semiconductor layer 11, the second semiconductor layer 13 and the third semiconductor layer 15 can be prevented from the turn-on. As a result, a further increase of the overcurrent and the resulting heat generation, i.e., so-called thermal runaway, can be suppressed, and the element breakdown can be avoided.

The guard region GR can be formed by partially forming an insulating body of, for example, silicon oxide or the like in the first semiconductor layer 11; subsequently, another semiconductor layer that is to be the second semiconductor layer 13, the third semiconductor layer 15, and the fourth semiconductor layer 17 is epitaxially grown. Alternatively, the portion of the first semiconductor layer 11 that becomes the guard region GR may be amorphized by ion-implanting hydrogen atoms thereinto.

Figure 3:
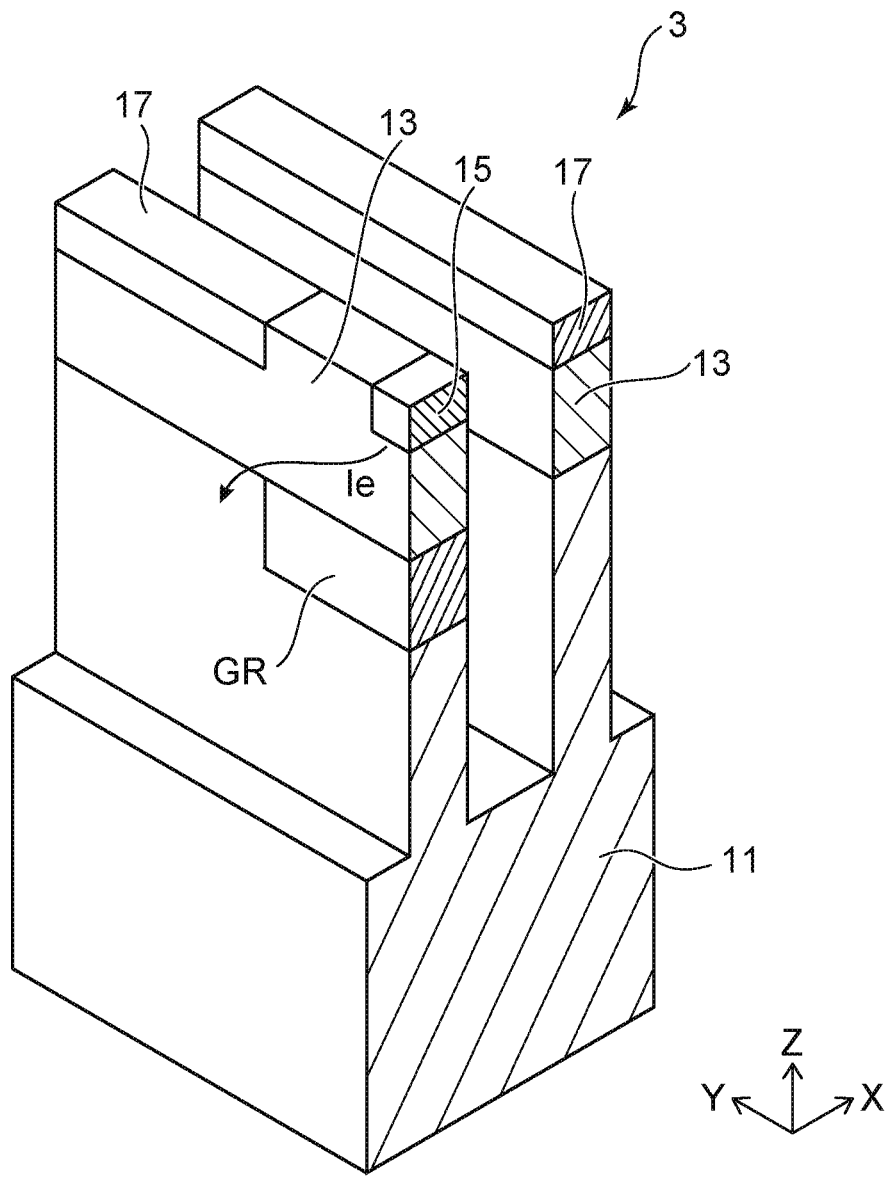
FIG. 3 is a perspective view schematically showing a semiconductor device according to a first modification of the embodiment.

FIG. 3 is a perspective view schematically showing a semiconductor device 3 according to a first modification of the embodiment. The semiconductor device 3 is, for example, a MOSFET. The first electrode SE, the second electrode DE, and the control electrodes GE1 to GE3 are not illustrated in FIG. 3. Alternately, the semiconductor device 3 may be an IGBT. This is also similar for the following examples.

In the semiconductor device 3, a first-conductivity-type inversion layer is induced by the control electrodes GE1 and GE2 at the interfaces between the second semiconductor layer 13 and the gate insulating film GI. During the turn-on period in the semiconductor device 3, an electron current flows from the third semiconductor layer 15 toward the first semiconductor layer 11 via the inversion layer. This is the same in the semiconductor devices according to the other examples.

According to the embodiment, the guard region GR is provided between the first semiconductor layer 11 and the second semiconductor layer 13, and thus, the electron current Ie flows toward the first semiconductor layer 11 from the third semiconductor layer 15 via a detour around the guard region GR. Therefore, the channel length from the third semiconductor layer 15 to the first semiconductor layer 11 is increased and makes the on-resistance increase. According to the embodiment, the advantage of suppressing thermal runaway is prioritized over the on-resistance.

As shown in FIG. 3, the fourth semiconductor layer 17 is apart from the third semiconductor layer 15. The second semiconductor layer 13 includes a portion that extends between the third semiconductor layer 15 and the fourth semiconductor layer 17. The width in a Z-direction of the first-conductivity-type inversion layer that is induced at the interface between the second semiconductor layer 13 and the gate insulating film GI can be increased thereby. As a result, in the semiconductor device 3, the path of the electron current that flows from the third semiconductor layer 15 to the first semiconductor layer 11 via the inversion layer can be widened, and the on-resistance can be reduced.

Figure 4A:
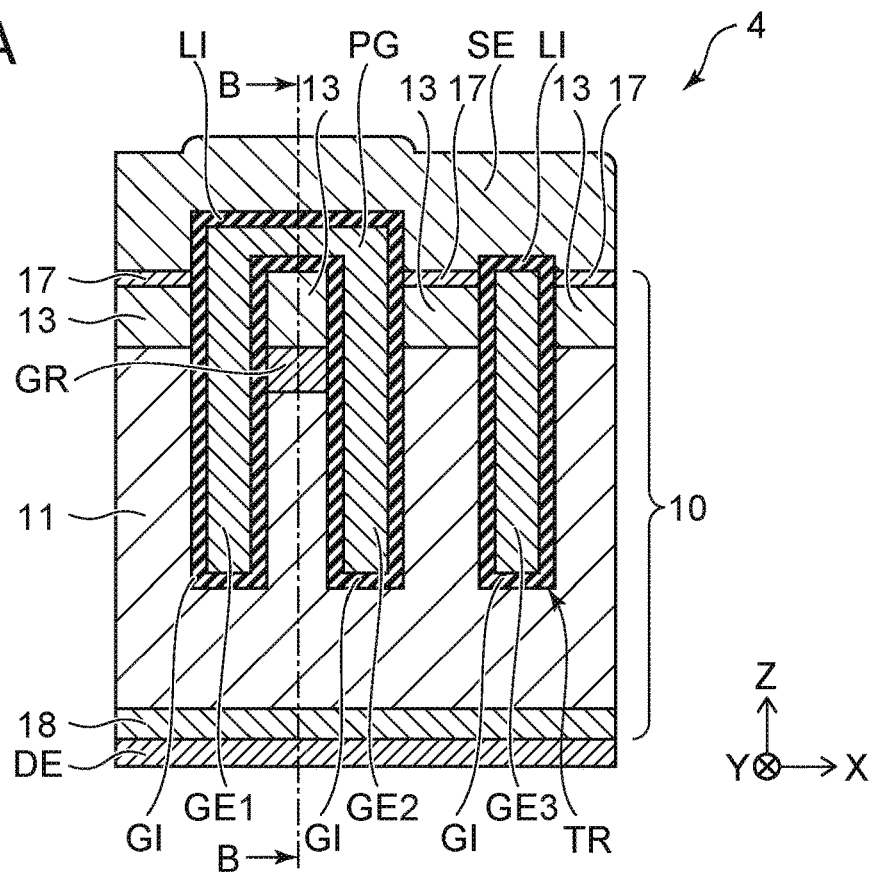
FIGS. 4A and 4B are schematic cross-sectional views showing a semiconductor device according to a second modification of the embodiment.
Figure 4B:
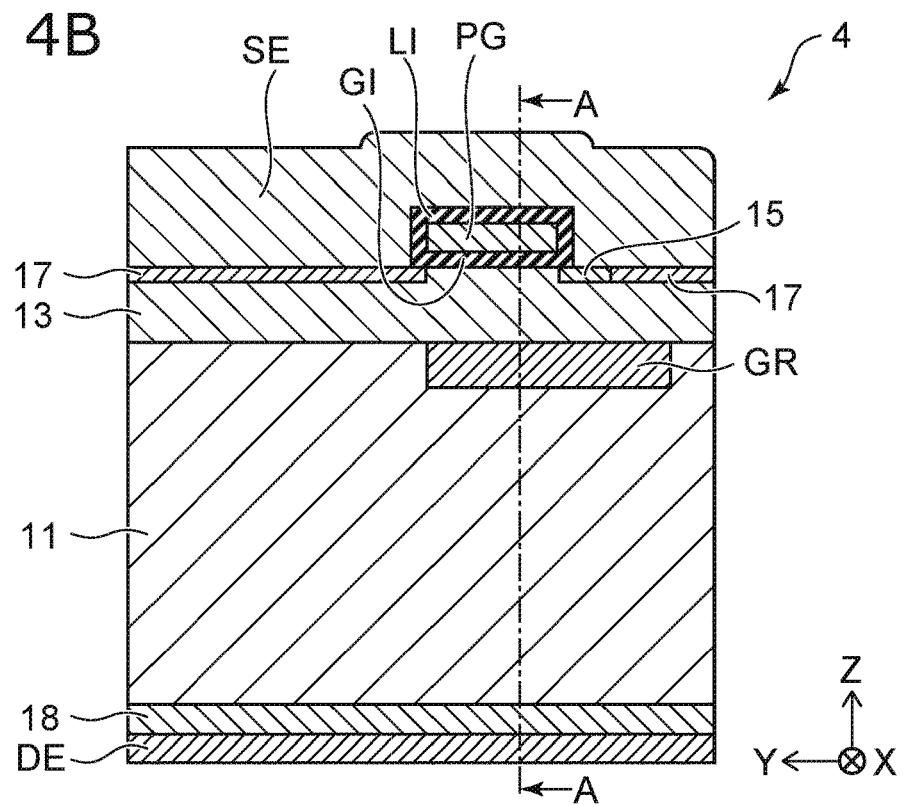

FIGS. 4A and 4B are schematic cross-sectional views showing a semiconductor device 4 according to a second modification of the embodiment.

FIG. 4A is a schematic view illustrating a cross section along line A-A shown in FIG. 4B.

FIG. 4B is a schematic view illustrating a cross section along line B-B shown in FIG. 4A.

As shown in FIG. 4A, the semiconductor device 4 includes a planar control portion PG that links the control electrode GE1 and the control electrode GE2. The planar control portion PG is provided on the front surface of the semiconductor part 10.

The planar control portion PG is provided between the second semiconductor layer 13 and the first electrode SE and faces the second semiconductor layer 13 via the gate insulating film GI. The planar control portion PG is electrically insulated from the first electrode SE by an inter-layer insulating film LI. The guard region GR that is provided between the control electrode GE1 and the control electrode GE2 is positioned between the first semiconductor layer 11 and the planar control portion PG. The third semiconductor layer 15 is not provided between the guard region GR and the planar control portion PG.

As shown in FIG. 4B, the planar control portion PG is provided on a region where the third semiconductor layer 15 and the fourth semiconductor layer 17 are apart from each other. The planar control portion PG is provided on a portion of the second semiconductor layer 13 that extends between the third semiconductor layer 15 and the fourth semiconductor layer 17.

In the semiconductor device 4, a first-conductivity-type inversion layer is also induced between the second semiconductor layer 13 and the planar control portion PG in addition to between the second semiconductor layer 13 and the control electrode GE1 and between the second semiconductor layer 13 and the control electrode GE2. The path of the electron current from the third semiconductor layer 15 to the first semiconductor layer 11 via the first-conductivity-type inversion layer can be enlarged thereby, and the on-resistance can be reduced.

Figure 5:
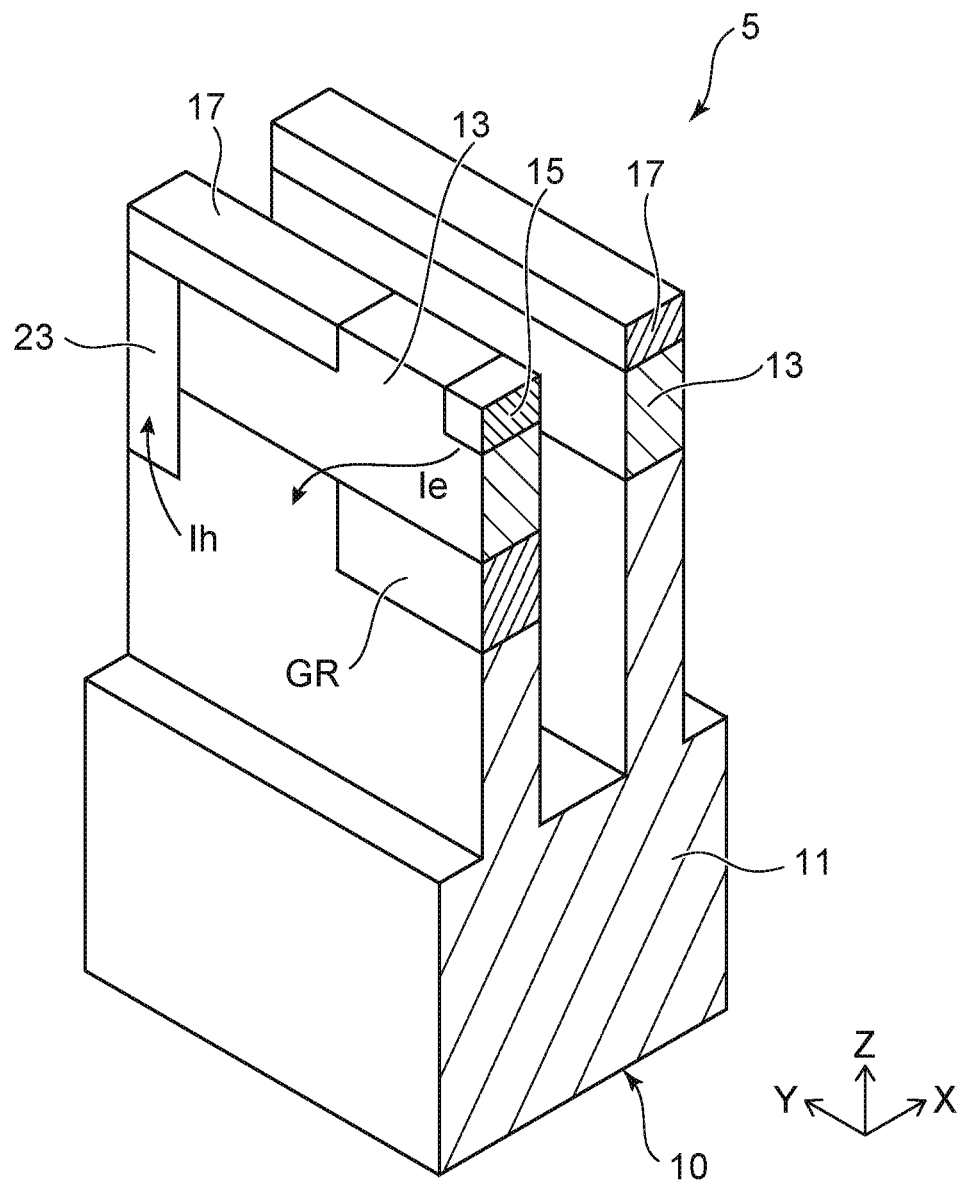
FIG. 5 is a perspective view schematically showing a semiconductor device according to a third modification of the embodiment.

FIG. 5 is a perspective view schematically showing a semiconductor device 5 according to a third modification of the embodiment. FIG. 5 shows the semiconductor part 10 of the semiconductor device 5. The first electrode SE, the second electrode DE, and the control electrodes GE1 to GE3, for example, are not illustrated in FIG. 5.

As shown in FIG. 5, the semiconductor part 10 further includes a seventh semiconductor layer 23 of the second conductivity type. The seventh semiconductor layer 23 is partially provided between the first semiconductor layer 11 and the fourth semiconductor layer 17. The seventh semiconductor layer 23 extends through the second semiconductor layer 13 and contacts the first and fourth semiconductor layers 11 and 17. The seventh semiconductor layer 23 includes a second-conductivity-type impurity with a higher concentration than the concentration of the second-conductivity-type impurity of the second semiconductor layer 13.

By providing the seventh semiconductor layer 23, a path of a hole current Ih from the first semiconductor layer 11 to the fourth semiconductor layer 17 is formed. The seventh semiconductor layer 23 serves as a hole ejection path from the first semiconductor layer 11 to the first electrode SE or the first electrode EE. When the semiconductor device 4 is turned off, the hole ejection from the first semiconductor layer 11 can be promoted thereby, and the switching loss can be reduced. The seventh semiconductor layer 23 is not limited to the example and is applicable also to the other semiconductor devices herein.

Figure 6:
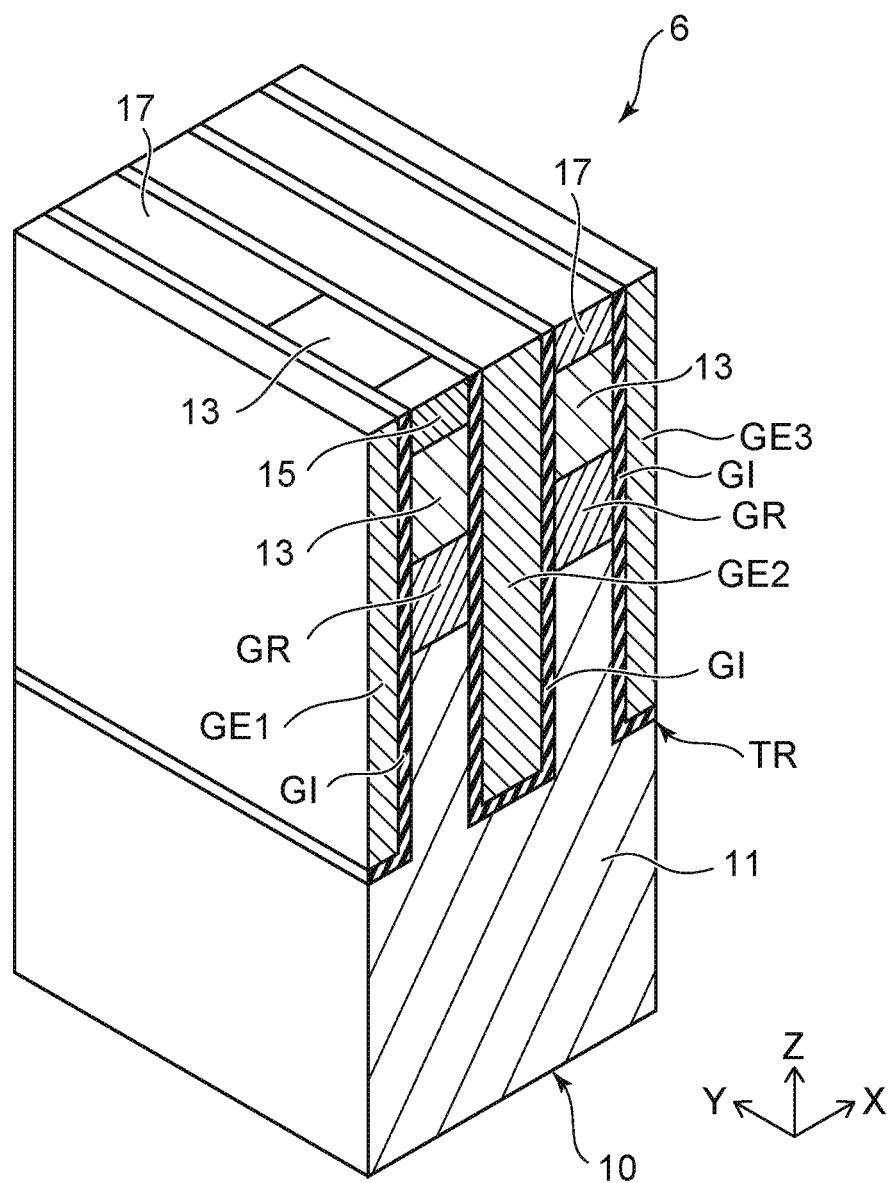
FIG. 6 is a perspective view schematically showing a semiconductor device according to a fourth modification of the embodiment.

FIG. 6 is a perspective view schematically showing a semiconductor device 6 according to a fourth modification of the embodiment. FIG. 6 is a schematic view showing the semiconductor part 10 of the semiconductor device 6. The first electrode SE and the second electrode DE, for example, are not illustrated in FIG. 6.

In the semiconductor device 6, the guard region GR is also provided between the control electrode GE2 and the control electrode GE3. The guard region GR is partially provided between the first semiconductor layer 11 and the second semiconductor layer 13 (referring to FIG. 2B). The control electrode GE3 is biased, for example, to have the same potential as the first electrode SE or the first electrode EE.

As shown in FIG. 6, the third semiconductor layer 15 is not provided between the control electrode GE2 and the control electrode GE3. Therefore, the electron current does not flow in the region of the semiconductor part 10 provided between the control electrode GE2 and the control electrode GE3; and this region serves as an ejection path of holes.

When the trench gate structure is downscaled, for example, it is difficult to provide the guard region GR only between the control electrode GE1 and the control electrode GE2. In such a case, the guard region GR is also provided between the control electrode GE2 and the control electrode GE3. The ejection path of the holes between the control electrode GE2 and the control electrode GE3 is narrowed thereby, but the ejection of the holes can be promoted by providing the seventh semiconductor layer 23 (referring to FIG. 5).

It should be noted that configurations that illustrate features of the semiconductor devices are not limited to each example, and are also applicable to other examples when technically feasible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part including a first semiconductor layer of a first conductivity type, a second semiconductor layer of a second conductivity type, a third semiconductor layer of the first conductivity type, and a fourth semiconductor layer of the second conductivity type, a plurality of trenches provided at a front side of the semiconductor part;
a first region partially provided between the first semiconductor layer and the second semiconductor layer, the first region being provided between the first semiconductor layer and the third semiconductor layer, the first region including a material having a lower thermal conductivity than the first semiconductor layer;
a first electrode provided at the front side of the semiconductor part; and
a plurality of control electrodes provided in the plurality of trenches, respectively, the plurality of control electrodes each being electrically insulated from the semiconductor part via an insulating film, the plurality of control electrodes including a first control electrode, and a second control electrode next to the first control electrode,
the second semiconductor layer being provided between the first semiconductor layer and the first electrode, the second semiconductor layer being provided between the first and second control electrodes, the second semiconductor layer facing the first and second control electrodes via the insulating film,
the third and fourth semiconductor layers being provided between the second semiconductor layer and the first electrode, the third and fourth semiconductor layers being electrically connected to the first electrode and arranged along a front surface of the second semiconductor layer facing the first electrode
the first region being provided continuously between two adjacent ones of the plurality of trenches, and
the first region being partially and discontinuously provided along a direction in which the trenches extend.

2. The device according to claim 1, wherein
the first region includes an insulating body.

3. The device according to claim 2, wherein
the insulating body includes a same material as the insulating film insulating the plurality of control electrodes from the semiconductor part.

4. The device according to claim 1, wherein
the first region extends between the first semiconductor layer and a portion of the fourth semiconductor layer along a boundary between the first semiconductor layer and the second semiconductor layer.

5. The device according to claim 1, wherein
the first region is provided between the first control electrode and the second control electrode.

6. The device according to claim 1, wherein
the third semiconductor layer is apart from the fourth semiconductor layer, and
the second semiconductor layer includes a portion provided between the third semiconductor layer and the fourth semiconductor layer.

7. The device according to claim 6, wherein
the plurality of control electrodes includes a planar control portion, the planar control portion being provided on a front surface of the semiconductor part facing the first electrode, and
the planar control portion links the first and second control electrodes and faces the portion of the second semiconductor layer via the insulating film.

8. The device according to claim 1, further comprising:
a second electrode electrically connected to the semiconductor part, the semiconductor part being provided between the first electrode and the second electrode,
the semiconductor part further including a fifth semiconductor layer provided between the first semiconductor layer and the second electrode, the fifth semiconductor layer being of the first conductivity type.

9. The device according to claim 8, wherein
the semiconductor part further includes a sixth semiconductor layer provided between the fifth semiconductor layer and the second electrode, the sixth semiconductor layer being of the second conductivity type.

10. The device according to claim 1, wherein
the semiconductor part further includes a seventh semiconductor layer partially provided between the first semiconductor layer and the fourth semiconductor layer, the seventh semiconductor layer being of the second conductivity type, the seventh semiconductor layer extending in a direction from the first semiconductor layer toward the fourth semiconductor layer, and
the seventh semiconductor layer is linked to the first and fourth semiconductor layers, the seventh semiconductor layer including a second-conductivity-type impurity with a higher concentration than a concentration of a second-conductivity-type impurity in the second semiconductor layer.

11. The device according to claim 1, wherein
the plurality of control electrodes further includes a third control electrode next to the second control electrode, the second control electrode being provided between the first control electrode and the third control electrode; and
the semiconductor part further includes another second semiconductor layer and a second region, said another second semiconductor layer being provided between the second control electrode and the third control electrode, the second region being provided between the first semiconductor layer and said another second semiconductor layer, the second region including a material having a lower thermal conductivity than the first semiconductor layer.

12. The device according to claim 11, wherein
the second region is provided between the second control electrode and the third control electrode.

13. The device according to claim 11, wherein
the second region includes a same material as the first region.

14. A semiconductor device comprising:
a semiconductor part including a first semiconductor layer of a first conductivity type, a second semiconductor layer of a second conductivity type, a third semiconductor layer of the first conductivity type, and a fourth semiconductor layer of the second conductivity type, a plurality of trenches provided at a front side of the semiconductor part;
a first electrode provided at the front side of the semiconductor part; and
a plurality of control electrodes provided in the plurality of trenches, respectively, the plurality of control electrodes each being electrically insulated from the semiconductor part via an insulating film, the plurality of control electrodes including a first control electrode, and a second control electrode next to the first control electrode,
the second semiconductor layer being provided between the first semiconductor layer and the first electrode, the second semiconductor layer being provided between the first and second control electrodes, the second semiconductor layer facing the first and second control electrodes via the insulating film,
the third and fourth semiconductor layers being provided between the second semiconductor layer and the first electrode, the third and fourth semiconductor layers being electrically connected to the first electrode and arranged along a front surface of the second semiconductor layer facing the first electrode,
the semiconductor part further including a first region partially provided between the first semiconductor layer and the second semiconductor layer, the first region being provided between the first semiconductor layer and the third semiconductor layer, the first region including a material having a lower thermal conductivity than the first semiconductor layer, wherein
the first region of the semiconductor part includes an amorphous semiconductor.

* * * * *